US008466457B2

(12) United States Patent
Birnstock et al.

(10) Patent No.: US 8,466,457 B2
(45) Date of Patent: Jun. 18, 2013

(54) LIGHT-EMITTING ORGANIC COMPONENT, ARRANGEMENT HAVING A PLURALITY OF LIGHT-EMITTING ORGANIC COMPONENTS AND ELECTRODE STRUCTURE

(75) Inventors: Jan Birnstock, Dresden (DE); Sven Murano, Dresden (DE); Oliver Langguth, Dresden (DE)

(73) Assignee: Novaled AG, Dresden (DE)

( * ) Notice: Subject to any disclaimer, the term of this patent is extended or adjusted under 35 U.S.C. 154(b) by 355 days.

(21) Appl. No.: 12/937,969

(22) PCT Filed: Jun. 13, 2008

(86) PCT No.: PCT/DE2008/000957
§ 371 (c)(1),
(2), (4) Date: Dec. 17, 2010

(87) PCT Pub. No.: WO2009/127175
PCT Pub. Date: Oct. 22, 2009

(65) Prior Publication Data
US 2011/0204343 A1    Aug. 25, 2011

(30) Foreign Application Priority Data
Apr. 15, 2008 (DE) .......................... 10 2008 019 049

(51) Int. Cl.
*H01L 35/24* (2006.01)
(52) U.S. Cl.
USPC .................................... 257/40; 257/E51.001
(58) Field of Classification Search
USPC ............................................ 257/40, E51.001
See application file for complete search history.

(56) References Cited

U.S. PATENT DOCUMENTS

| 2006/0066223 A1 | 3/2006 | Pschenitzka |
| 2006/0209225 A1 | 9/2006 | Sakamoto et al. |
| 2006/0273310 A1 | 12/2006 | Birnstock et al. |

FOREIGN PATENT DOCUMENTS

| DE | 102006013408 | 9/2007 |
| DE | 102006052029 | 3/2008 |
| EP | 1003229 | 5/2000 |
| EP | 1549110 | 6/2005 |
| GB | 2392023 | 2/2004 |
| JP | 2005-158483 A | 6/2005 |
| JP | 2005-294066 A | 10/2005 |
| JP | 2006-286393 A | 10/2006 |
| WO | 2005/060586 | 7/2005 |
| WO | 2008/040323 | 4/2008 |

OTHER PUBLICATIONS

Japanese Office Action for JP Application No. 2011-504306 mailed May 15, 2012 (6 pages).

(Continued)

*Primary Examiner* — Anthony Ho
(74) *Attorney, Agent, or Firm* — Sutherland Asbill & Brennan LLP

(57) ABSTRACT

The invention relates to a light-emitting organic component, in particular a light-emitting organic diode, having an electrode and a counter electrode and an organic region arranged between the electrode and the counter electrode, the organic region being formed between the electrode and the counter electrode with a uniform material composition over its planar expansion, the electrode being formed by comb-shaped sub-electrodes electrically shorted among each other for which the comb-shaped electrode sections protruding from a respective comb-shaped electrode connecting section are arranged intermeshing with the organic region at least in an overlap region. Furthermore, the invention relates to an array with a serial connection of several light-emitting organic components and an electrode structure for an electronic component.

17 Claims, 6 Drawing Sheets

OTHER PUBLICATIONS

D'Andrade, B.W.; Holmes, R.J.; and Forrest, S.R; "Efficient Organic Electrophosphorescent While-Light-Emitting Device with a Triple Doped Emissive Layer," Advanced Materials, vol. 16, Issue 7, pp. 624-628 (Apr. 20, 2004); published by WILEY-VCH Verlag GmbH & Co. KGaA, Weinheim, online and in the USA.

He, G. et al. "High-efficiency and low-voltage p-i-n electrophosphorescent organic light-emitting diodes with double-emission layers," Applied Physics Letters, vol. 85, Issue 17, p. 3911; published by the AIP (American Institute of Physics, online and in the USA.

Wittmann-Regis, Agnes; Patent Cooperation Treaty: International Preliminary Report on Patentability for International Application No. PCT/DE2008/000957; Nov. 18, 2010; published by the International Bureau of the WIPO.

Japanese Office Action for JP Application No. 2011-504306 mailed Feb. 26, 2013 (4 pages) (English translation).

LIGHT-EMITTING ORGANIC COMPONENT, ARRANGEMENT HAVING A PLURALITY OF LIGHT-EMITTING ORGANIC COMPONENTS AND ELECTRODE STRUCTURE

CROSS-REFERENCE TO RELATED APPLICATIONS

This is a submission pursuant to 35 U.S.C. 154(d)(4) to enter the national stage under 35 U.S.C. 371 for PCT/DE2008/000957, filed Jun. 13, 2008. Priority is claimed under 35 U.S.C. 119(a) and 35 U.S.C. 365(b) to German Patent Application Number 10 2008 019049.7, filed Apr. 15, 2008. The subject matters of PCT/DE2008/000957 and German Patent Application Number 10 2008 019049.7 are hereby expressly incorporated herein by reference in their entirety.

FIELD OF THE INVENTION

The invention relates to a light-emitting organic component, an array with several light-emitting organic components and an electrode structure.

BACKGROUND OF THE INVENTION

In recent years, light-emitting organic components in the shape of organic light-emitting diodes (OLEDs) which emit coloured light, in particular white light, have attracted more and more interest. It is generally known that the technology of organic light-emitting components has great potential for possible applications within the held of lighting technology. By now, organic light-emitting diodes achieve performance efficiencies which lie within the range of conventional electric bulbs (cf. Forrest et al., Adv. Mat. 7 (2004), 624).

Organic light-emitting diodes are usually formed by means of a layer construction which is arranged on a substrate. In the layer construction, an organic layer array is arranged between an electrode and a counter electrode such that an electric potential can be supplied to the organic layer array over the electrode and the counter electrode. The organic layer array is made from organic materials and comprises a light-emitting region. Within the light-emitting region, charge carriers, namely electrons and holes, recombine which are injected into the organic layer array when applying the electric potential to the electrode and the counter electrode and are there transported to the light-emitting region. A substantial increase in efficiency during the light generation could be achieved by integrating electrically doped layers into the organic layer array.

Organic light-emitting components may be used in a wide variety of areas of application to generate light of any colour which includes in particular display devices, lighting devices and signalling devices.

In one embodiment, the organic light-emitting components can be designed in such a way that they emit white light. Such components have the potential to be a significant alternative to the lighting technologies currently dominating the market, for example incandescent lamps, halogen lamps, low-voltage fluorescent lamps or the like.

Nevertheless, substantial technical problems are still to be solved for a successful commercialisation of the technology of organic light-emitting components. In particular, it is a challenge to generate great quantities of light by means of OLED components, which quantities are needed for general lighting applications. The quantity of light emitted by an OLED component is determined by two factors. These are the light intensity in the region of the lighting area of the component and the size of the lighting area. The light intensity of an organic light-emitting component can not be increased at will. Furthermore, the life of organic components is also substantially influenced by the light intensity. If the light intensity of an OLED component is doubled, for example, its life is shortened by a factor of two to four. In this connection, life is defined as the time passing until the initial light intensity of the OLED component has dropped to half its value during operation with a constant current.

The lighting area of an OLED component for lighting applications has to be chosen in accordance with a desired emitted quantity of light. The aim should be for it to lie within the range of a few square centimetres up to a size of more than one square meter.

As an electrical component, OLED components are typically operated at a low voltage in the range of from about 2 V to about 20 V. The current flowing through the OLED component is determined by the lighting area. In the case of a relatively small lighting area of the OLED component of about 100 cm2, a current of 1 A would already be needed at an assumed current efficiency of 50 cd/A and an application light intensity of 5000 cd/m2.

To supply an organic light-emitting component with such a current, however, poses a significant technical problem which can not be solved without further ado in a cost-efficient manner in commercial lighting applications. As is known, the electric power loss of the current supply is proportional to the electric resistance of the feed and to the square of the flowing current. Thus, to keep the power loss small even at high currents, electrical feeds would have to be used with a very low resistance, i.e. a large cross-section. However, this is to be particularly avoided in a component whose outstanding property, amongst others, is the flat design. If larger component surfaces are required, the supply current would have to be increased further which would aggravate the problems in the current supply further.

For this reason, it was suggested to electrically connect several OLED elements within an organic light-emitting component in series (cf. GB 2 392 023 A). In this connection, the total surface area of the organic light-emitting component is divided into individual OLED components which are electrically linked with each other in one or more serial connections. In this way, the operating voltage of the light-emitting component is increased by a factor of about one which corresponds to the number of the OLED components connected in series, the flowing current being reduced by the same factor. By reducing the operating current while increasing the operating voltage, a marked simplification of the actuation of the light-emitting component may thus be achieved with the same performance as it is generally markedly easier to supply an electrical component with a high voltage instead of a high current. Another advantage resulting from the use of the serial connection of OLED components is that, in the case of a short between the two electrodes, namely the cathode and the anode, one of one of the OLED components, a part of the lighting area of the organic light-emitting component indeed fails, but all in all, the light-emitting component still emits light and the total quantity of light emitted even largely remains unchanged due to the now increased operating voltage for the remaining, not failed OLED components. Thus, such a light-emitting component with a serial connection of OLED components can still be used, even after a short of one of the OLED components. In contrast, an organic light-emitting component which only has a single OLED component is unusable in the case of a short between anode and cathode.

For the production of OLED light-emitting components with a serial connection of OLED components, however, a complex production method is necessary. On the one hand, it is necessary to structure the electrode which is formed on the supporting substrate to define the electrodes allocated to the individual OLED components connected in series. Furthermore, it is necessary to structure the organic layer arrays of the individual OLED components and the cover electrode formed thereon. For this, several known methods come into consideration.

In the case of OLEDs in which organic materials are used which may be applied by means of vacuum evaporations, a suitable method for the structuring is evaporation by means of shadow masks. Other methods are, for example, the application by means of LITI ("Laser Induced Thermal Imaging") in which from a carrier film loaded with organic material, at least one part of the organic material is transferred onto the substrate in which the carrier film is heated by laser with pinpoint accuracy. However, the LITI method can only be used for the structuring of the organic layer array of the OLED components. To structure the cover electrode which itself usually consists of metals such as silver, aluminium or magnesium or a conductive transparent oxide such as indium tin oxide, another structuring method has to be employed.

The structuring methods result in considerable expense within the course of the production of the organic light-emitting component, resulting in high costs. In the case of the use of shadow masks, the problem of a limited resolution furthermore exists, i.e. the distance between the individual OLED components connected in series is limited by the dimensions of the bars of the shadow mask. In this connection, it should be noted that a certain bar width of the shadow mask is required, depending on the size of the recesses between the bars of the shadow mask, to ensure the mechanical stability of the shadow mask.

Thus, to simplify the structuring by means of shadow masks, it makes sense to dispense with a fine resolution of the regions structured by means of the shadow mask. This can be performed by designing the OLED components connected in series relatively large, for example having a size of about 1 cm2. Through this, it is made possible to use shadow masks with low precision which may be oriented by means of simple methods, for example by means of orientation using positioning pins. Such methods are markedly cheaper in mass production than methods for fine adjustment which are based on the orientation by means of positioning markers under a microscope, for example.

Furthermore, the use of shadow masks is a limiting factor in terms of the achievable processing times as a fine adjustment of the shadow masks plays a not negligible part in the total process duration. By means of using a less precise method, the process times associated with the positioning can be shortened.

For particular methods for the production of organic light-emitting components, for example the continuous roll-to-roll method, further problems result from the known use of shadow masks. On the one hand, the shadow mask has to be carried along with the substrate on which the layer stack with the electrodes and the organic layer array are to be formed in such a method without changing the position of the shadow mask in relation to the substrate. On the other hand, the shadow mask has to be aligned with the substrate in such a method, the substrate optionally having to be stopped in the roll-to-roll method. It is thus desirable to have a process available in which the use of high-resolving shadow masks is not required.

The use of less precise shadow masks does not really lead to an optimisation as it is associated with significant disadvantages. In this connection, only larger OLED sub-areas can be formed. If one of these sub-areas fails due to a short, a large part of the lighting area of the component becomes inactive, i.e. it remains dark during the operation of the light-emitting component. However, the entire component is significantly affected with regard to its functionality through this. In fact, there is a minor decrease of the voltage in a serial connection over the shorted OLED component through which the voltage for the other OLED components increases which is the reason why the transmitted light is all in all only changed slightly, however, the optical effect of the organic light-emitting component is substantially deteriorated. This is unacceptable for application purposes. The light-emitting component is perceived by the viewer as being faulty. Furthermore, electrical shorts in OLED components lead to the entire current which normally flows in a distributed manner over the entire surface area only being led through the point of the short. Through this, a high temperature rises takes place locally which results in ohmic losses and the risk existing that the resistance is markedly increased at the point of the short and the point of the short thus becomes isolating, for example due to a delamination of organic or inorganic layers. There is a risk that the encapsulation applied to protect the light-emitting component does not withstand this local thermal stress, in particular when using a thin-film encapsulation, as is considered nowadays for OLED lighting elements of the future. These disadvantageous effects increase all the more, the larger the surface area of the OLED component is.

Besides the efficiency and the life of light-emitting organic components, the appearance of the component above all is naturally critical for the commercial success. It is in the nature of the OLED that the radiation of light onto larger surface areas is not completely homogenous as the transparent electrode most notably has a relatively low conductivity of typically between 1 ohm/sq and 300 ohm/sq. This means that a voltage drop exists over the transparent electrode due to the current flowing through the OLED which results to certain areas of the OLD emitting darker light than others. Particularly striking is this problem in OLEDs with particularly steep current-voltage characteristics. This applies especially to OLEDs of the pin type which are considered as being particularly suitable for lighting applications due to their high performance efficiency. Different suggestions were made to improve the homogeneity of the OLED. So called metal grids, i.e. thin metal lines are widely used which are in contact with the transparent electrode and take over a big part of the current transport. This solution is technically elaborate as it is associated with several coating and photolithography steps.

SUMMARY OF THE INVENTION

It is an object of the invention to create a light-emitting organic component, an array with a serial connection of several light-emitting organic components and an electrode structure by means of which the component reliability is improved, in particular also when shorts occur. Furthermore, the lighting properties should be improved in the organic light-emitting components.

This object is achieved according to the invention by a light-emitting organic component according to the independent claim 1 and an array with a serial connection of several light-emitting organic components according to the independent claim 14. Furthermore, an electrode structure according to the independent claim 15 is created. Advantageous implementations of the invention are the subject matter of dependent claims.

According to an aspect of the invention, a light-emitting organic component, in particular a light-emitting organic diode, having an electrode and a counter electrode and an organic region arranged between the electrode and the counter electrode is created, the organic region being formed between the electrode and the counter electrode with a uniform material composition over its planar expansion, the electrode being formed by comb-shaped sub-electrodes electrically shorted among each other for which the comb-shaped electrode sections protruding from a respective comb-shaped electrode connecting section are arranged intermeshing with the organic region at least in an overlap region.

According to a further aspect of the invention, an array, in particular a lighting device or display device, with a serial connection of several light-emitting organic components of the above-mentioned type is created.

According to another aspect of the invention, an electrode structure for an electronic component, in particular an organic light-emitting component, having an electrode is created which is formed by comb-shaped sub-electrodes electrically shorted among each other, comp-shaped electrode sections protruding from a respective comb-shaped electrode connecting section are arranged intermeshing at least in areas in the comb-shaped sub-electrodes. In a practical exemplary embodiment, the electrode may be made of ITO.

In connection with the component, the invention encompasses the idea to form an electrode comprised by the respective electrode pair in the light-emitting organic component by means of several comb-shaped sub-electrodes electrically shorted among each other which means that the electrode thus formed consists of the comb-shaped sub-electrodes. In the comb-shaped sub-electrodes, comb-shaped electrode sections protruding from a respective comb-shaped electrode connecting section intermesh with the organic region at least in an overlap region. In a preferred implementation, the intermeshing can be implemented in such a manner that protruding comb-shaped electrode sections are arranged alternately with comb-shaped sub-electrodes opposing each other. The protruding comp-shaped electrode sections formed on a comb-shaped electrode connecting section are electrically shorted by means of the comb-shaped electrode connecting section which forms a kind of connection for the protruding comb-shaped electrode sections. Several components implemented in the above-mentioned manner can be integrated into a serial connection.

The comb-like implementation of the electrode with the comb-shaped sub-electrodes, be it in the separate generation of the electrode structure or in the component production process, may be created during the production by means of photolithography, for example. Such a fine structuring is possible without problems and without additional costs and requires no additional expenditure. In this way, the distance of the intermeshing protruding comb-shaped electrode sections can be kept very low. By means of the intermeshing protruding comb-shaped electrode sections, a homogeneous lighting appearance is generated during the operation of the light-emitting organic component from the point of view of the viewer.

In the production of the component or of the array of components, a simple shadow mask technology may be used for the forming of the organic region and a cover electrode onto which no particular demands with regard to the positioning precision are to be made.

Another advantage is that the proposed light-emitting organic component has a better failure behaviour when shorts occur in the electrode region. Even if individual protruding comb-shaped electrode sections fail due to a short, a substantially homogenous luminous field still results for the viewer during operation. In this connection, the maintenance of the performance efficiency of the component is all the better the further the location of an occurring short within the region of a protruding comb-shaped electrode section is away from the allocated comb-shaped electrode connecting section. Actually, a short within the region of a protruding comb-shaped electrode section does not lead to the complete failure of the light-emitting organic component. It in fact remains limited to the region of the affected protruding comb-shaped electrode section. The proposed electrode structure as such contributes to the implementation of the advantages described above.

In a practical exemplary embodiment in which ITO is used as the material for the electrode made of the comb-shaped sub-electrodes, this behaviour results from ITO having a relatively high layer resistance which also results in a high resistance of the ITO sections at a high aspect ratio for the protruding comb-shaped electrode sections, for example an aspect ratio of 10:1. However, as due to the parallel connection of the plurality of protruding comb-shaped electrode sections only a very small current flows over the individual sections during normal operation of the component in which the proposed electrode structure may then be employed, the efficiency of the component stays high. Only in the moment of the short between electrode and counter electrode, a locally higher current results which, however, is limited by the high resistance in the protruding comb-shaped electrode sections. Thus, in the case of a short, only on the area of the affected protruding comb-shaped electrode section made of ITO no more light is emitted. The remaining surface area of the component will continue to be illuminated with virtually unchanged light intensity. If the protruding comb-shaped electrode section formed from ITO, for example, are implemented sufficiently thin, for example with a width between about 10 µm and a few millimetres, the viewer will not notice the short at all.

Thus, on the one hand, the opportunity is created by means of the invention to keep the performance efficiency of the light-emitting organic component high, even in the case of a local short. Furthermore, the optical appearance of the component of the component having the proposed electrode structure stays substantially uninterrupted for the viewer during operation, even in the case of a local short.

A preferred further development of the invention provides for the protruding comb-shaped electrode sections being arranged intermeshing and complementary in shape. In this connection, complementary in shape are usually the base area shapes of the intermeshing protruding comb-shaped electrode sections such that an overlap between the electrode and the organic region as big as possible can be achieved.

In a practical implementation of the invention, it may be provided for protruding comb-shaped electrode sections being formed with non-parallel lateral edges.

An advantageous embodiment of the invention provides for the protruding comb-shaped electrode sections being formed with a base area shape selected from the following group of base area shapes: base area shape tapering away from the respective comb-shaped electrode connecting section, base area shape widening away from the respective comb-shaped electrode connecting section, triangle and trapeze. In general, such base area shapes are thus characterized by a shape tapering into one direction, the tapering of the base area shape of the protruding comb-shaped electrode section taking place either starting from the allocated comb-shaped electrode connecting section or towards this, depending on the embodiment. In one implementation, it can be provided for the tapered shape on the protruding comb-shaped electrode section only starting in a distance from the comb-shaped electrode connecting section such that a feed section with substantially parallel edges is formed between the tapered comb-shaped electrode section and the allocated comb-shaped electrode connecting section. In this connection, it can be provided for the overlap region starting at the transition between the feed section and the tapering section of the protruding comb-shaped electrode sections.

A further development of the invention preferably provides for the protruding comb-shaped electrode sections being formed with a uniform base area shape. It can be provided for the comb-shaped sub-electrodes overall all being formed identically with regard to their base area shape. However, it can also be provided for the comb-shaped sub-electrodes being implemented completely or partially different with regard to their base area shape to achieve an individual adaptation to different light-emitting organic components.

In an advantageous implementation of the invention, it can be provided for the protruding comb-shaped electrode sections being electrically shorted among each other by means of the respective comb-shaped electrode connecting section external to the organic region.

A further development of the invention can provide for the counter electrode being formed within the planar expansion of the organic region and with a surface area expansion being smaller in comparison to that.

A preferred further development of the invention provides for an end of the protruding comb-shaped electrode sections distal to the respective comb-shaped electrode connecting section terminating with an edge of the organic region. This means in other words that the protruding comb-shaped electrode section does not project from the organic region within the region of the distal end.

In a practical implementation of the invention, it can be provided for an end of the protruding comb-shaped electrode sections proximal to the respective comb-shaped electrode connecting section having a length A up to the edge of the organic region and the protruding comb-shaped electrode sections being formed with a length ratio A:D of at least 1, preferably at least 3 and more preferably at least 10, D being the width of the protruding comb-shaped electrode section. At a ratio A:D of 1, in the case of a short near the comb-shaped electrode connecting section, by using a diffuser film, a component still appears to a viewer in a sufficient distance to be illuminated homogenously when viewed with the naked eye, i.e. without special magnifying means, for example a magnifying glass. As long as the ratio A:D is 3 in this case, a homogeneous appearance would also be achievable without a diffuser film. At a ratio of 10, a homogeneous light intensity could still be perceived by a viewer from a sufficient distance already at a number of streaks of 10 by means of a diffuser film.

An advantageous embodiment of the invention provides for the electrode formed by the comp-shaped sub-electrodes being an electrode on the substrate side. As an alternative to the electrode on the substrate side which is also referred to as base electrode, the top or cover electrode may be formed with comp-shaped sub-electrodes.

A further development of the invention preferably provides for a lateral distance between adjacent ones of the protruding comb-shaped electrode sections within an intermeshing region being at least about 10 µm. Through this, it is achieved that the presence of non-illuminated regions between the protruding comb-shaped electrode sections is no longer resolvable with the naked eye.

In an advantageous implementation of the invention, it can be provided for a diffuser element planarly overlapping at least with the organic region being formed. The diffuser element may be implemented as a diffuser disk or a diffuser film, for example. The planarly overlapping diffuser element contributes to an improved lighting appearance of the component for the viewer not only during normal operation of the component, but in particular also in the case of a partial failure of parts of the component due to a short.

A further development of the invention can provide for an electrical safety structure in each case being allocated to the protruding comb-shaped electrode sections. The electrical safety structure which is a safety fuse, for example, may comprise several individual safety structures, each of which being allocated to one of the protruding comb-shaped electrode sections, or one safety structure commonly formed for several protruding comb-shaped electrode sections. The design of the respective safety structure is implemented such that it independently triggers an electric isolation when an increased operating current occurs. In this way, affected sections of the electrode are separated from other sections when a short occurs such that the operation of the remaining sections of the component can continue.

In an advantageous implementation of the invention, it may be provided for the electrical safety structure having a layer made of organic material. The organic layer can be an electrically doped layer. The implementation is performed as a p-doped or n-doped semiconductor layer. The electrical safety structure may be formed completely or partially with the electrically doped layer. In a preferred implementation, the electrically doped layer is formed corresponding with the layers from the organic region with regard to its material composition which has the advantage that the electrically doped layer of the safety structure can be created during the production simultaneously with the layer in the organic region implemented in the same way as long as this can be conveniently integrated into the production process. The electrically doped layer is preferably formed having a layer thickness between about 10 nm and about 100 µm. A layer thickness of about 10 nm is considered as a thickness which is at least required to safely form a closed organic layer with customary production lines. 100 µm is a layer thickness which can still be realised within an appropriate technical process scope.

Alternatively or additional to the forming of the electrically doped layer, a layer made of organic material which is not electrically doped may be provided for in an implementation of the safety structure. With regard to the layer thickness of the undoped organic layer, above explanations relating to the doped organic layer apply accordingly.

A further development of the invention may provide for the electrical safety structure having a metal layer. The electrical safety structure may be formed completely or partially of the metal layer such that in an implementation, it consists of the metal layer. An implementation may also provide for the electrical safety structure consisting of the metal layer and the layer made of organic material. In an implementation, the metal layer can be combined with at least one of the following layers, namely the electrically doped organic layer and the organic layer which is undoped. The metal layer can cover the organic layer in sections or completely. In this connection, it may be provided for in an embodiment that the metal layer covers the layer made of organic material in sections or completely. The organic layer, be it electrically doped or not, may be formed in contact with the allocated electrode sections or the further electrode sections or without contact therewith. In the different implementations, the metal layer may be in electrical contact only with the allocated electrode sections, only with the one or more further electrode sections or with both.

The organic layer has a layer thickness between about 10 nm and about 50 μm, for example. The metal layer is preferably formed having a layer thickness between about 10 nm and about 10 μm.

The layer thicknesses are chosen in such a way that in the case of a short within the area of the electrode sections and the increased current flow associated therewith, the electrically doped layer is warmed to such a great extent that it is electrically isolated, for example by melting. The organic material of the electrically doped layer and the substrate surface on which the light-emitting organic component is formed are chosen such that the electrically doped layer decrosslinks when melting. In the combination with the metal layer, this is thin enough to tear in the case of the decrosslinking. Furthermore, the metal layer is so thin that in the case of a short, a sufficiently high heat is generated by the ohmic resistance to cause a melting of the electrically doped layer made of organic material. The combination of metal layer and electrically doped layer made of organic material has the advantage that the temperature at which the electric isolation effect is triggered by the safety structure can be selected precisely. Through this, the electrical safety structure can be adapted to individual application purposes by means of the parameters of melt temperature of the electrically doped layer, thickness of the metal layer and design of the light-emitting organic component and the current flow resulting from this.

The melting of organic materials often already takes place at temperatures below 200° C. Electrical safety structures based on metals or other organic electric conductors only blow at markedly higher temperatures.

Thin films made of organic material even may already decrosslink below their melt point which often occurs in connection with liquid-crystalline materials, for example. In a preferred implementation, the organic layer of the safety structure is made of a liquid-crystalline material.

Another advantage of the combination of organic layer which is optionally electrically doped and metal layer for the electrical safety structure consists in that the metal layer can be chosen to be relatively thick as it does not need to heat up to such a high temperature in the case of the short as this is the case with a purely metallic safety structure. Through this, the ohmic losses at the safety structure during normal operation can be reduced. However, it has to be taken care that the metal layer is thin enough to be broken through one of the layers made of organic material.

A preferred further development of the invention provides for the electrical safety structure having a layer made of a material selected from the following materials: conductive oxide and conductive ceramics.

In a practical implementation of the invention, it can be provided for the electrical safety structure being implemented as a safety fuse structure. When activating the electrical safety structure due to an increased current, melting takes place, resulting in an electric isolation occurring.

The implementation possibilities for the electrode described above in connection with a component may also be provided individually or in any combination in connection with the electrode structure as such, it being possible to produce the electrode structure as an independent product or semi-finished product, just as an electrode production can be implemented integrated with the component production, be it in the case of an organic light-emitting component or another electronic component. A separate production of the electrode structure with the electrode in the different implementations may for example be achieved by simply interrupting the described production processes after the electrode has been fowled without continuing with the formation of the organic region. The electrode structure thus formed may then be employed for any electronic components. These include in particular organic solar cells. The advantages described above, as far as their origin lies in the electrode implementation as such, accordingly result in the different implementations for the electrode structure.

In the following, preferred implementation in connection with the electrode structure are explained in even more detail, the explanations given above accordingly apply in connection with identical features, these explanations being omitted in the following to avoid repetitions.

In the case of the electrode structure, a preferred further development of the invention provides for the protruding comb-shaped electrode sections being arranged intermeshing and complementary in shape. In the case of the electrode structure, in a practical implementation of the invention, it may be provided for protruding comb-shaped electrode sections being formed with non-parallel lateral edges.

In the case of the electrode structure, an advantageous embodiment of the invention provides for the protruding comb-shaped electrode sections being formed with a base area shape selected from the following group of base area shapes: base area shape tapering away from the respective comb-shaped electrode connecting section, base area shape widening away from the respective comb-shaped electrode connecting section, triangle and trapeze.

In the case of the electrode structure, a further development of the invention preferably provides for the protruding comb-shaped electrode sections being formed with a uniform base area shape. In the case of the electrode structure, in an advantageous implementation of the invention, it can be provided for the protruding comb-shaped electrode sections being externally electrically shorted among each other by means of the respective comb-shaped electrode connecting section.

An advantageous embodiment of the invention provides for the electrode formed by the comp-shaped sub-electrodes being formed for an electrode on the substrate side. As an alternative to the electrode on the substrate side which is also referred to as base electrode, the top or cover electrode may be formed with comp-shaped sub-electrodes.

In the case of the electrode structure, a further development of the invention preferably provides for a lateral distance between adjacent ones of the protruding comb-shaped electrode sections within an intermeshing region being at least about 10 μm.

In the case of the electrode structure, a further development of the invention can provide for an electrical safety structure in each case being allocated to the protruding comb-shaped electrode sections.

In the case of the electrode structure, in an advantageous implementation of the invention, it may be provided for the electrical safety structure having a layer made of organic material.

Alternatively or additional to the forming of the electrically doped layer, a layer made of organic material which is not electrically doped may be provided for in an implementation of the safety structure. With regard to the layer thickness of the undoped organic layer, above explanations relating to the doped organic layer apply accordingly.

In the case of the electrode structure, a further development of the invention may provide for the electrical safety structure having a metal layer.

In the case of the electrode structure, a preferred further development of the invention provides for the electrical safety structure having a layer made of a material selected from the following materials: conductive oxide and conductive ceramics.

In the case of the electrode structure, in a practical implementation of the invention, it can be provided for the electrical safety structure being formed as a safety fuse structure.

BRIEF DESCRIPTION OF THE FIGURES

In the following, the invention is explained in more detail using preferred exemplary embodiments with reference to figures of a drawing. They show.

DETAILED DESCRIPTION

Figure 1:
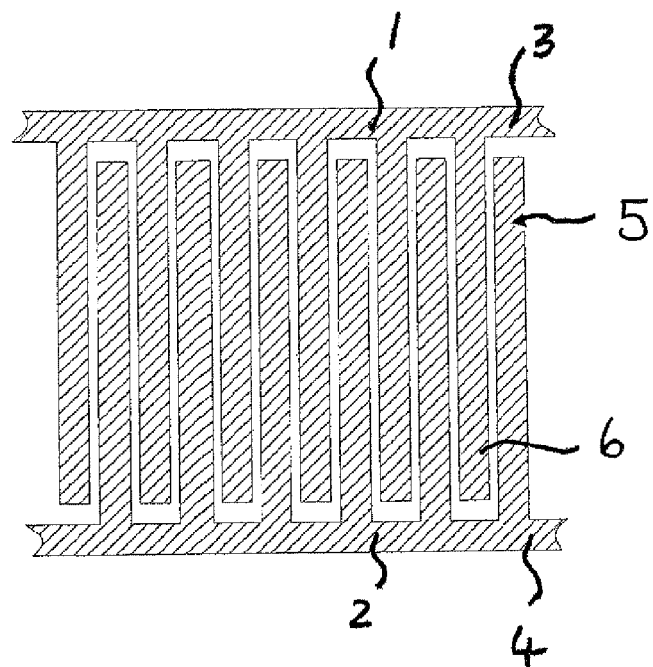
FIG. 1 a section of an electrode for a light-emitting organic component in which comb-shaped sub-electrodes are arranged intermeshing, FIG. 2 the section of the electrode for the light-emitting organic component in accordance with FIG. 1 having an organic region arranged thereupon, FIG. 3 an illumination pattern for a light-emitting organic component having intermeshing comb-shaped sub-electrodes, FIG. 4 a section of an electrode for a light-emitting organic component in which comb-shaped sub-electrodes intermesh with trapeze-shaped protruding comb-shaped electrode sections, FIG. 5 the section of the electrode for the light-emitting organic component in accordance with FIG. 4 having an organic region arranged thereupon, FIG. 6 a section of an electrode for a light-emitting organic component in which comb-shaped sub-electrodes intermesh, trapeze-shaped protruding comb-shaped electrode sections being arranged complementary in shape and being connected to comb-shaped electrode connecting sections by means of a supply section, FIG. 7 the section of the electrode for the light-emitting organic component in accordance with FIG. 6 having an organic region arranged thereupon, FIG. 8 a schematic detailed illustration for the section of the electrode for the light-emitting organic component in FIG. 1, and FIG. 9 the section of the electrode for the light-emitting organic component having the organic region arranged thereupon in accordance with FIG. 7, safety structures allocated to the protruding comb-shaped electrode sections being shown schematically.

FIG. 1 shows a section of an electrode for a light-emitting organic component in which comb-shaped sub-electrodes 1, 2 are arranged intermeshing and forming an electrode of the component. The comb-shaped sub-electrodes 1, 2 each have a comb-shaped electrode connecting section 3, 4 on which protruding comb-shaped electrode sections 5, 6 are formed.

Figure 2:
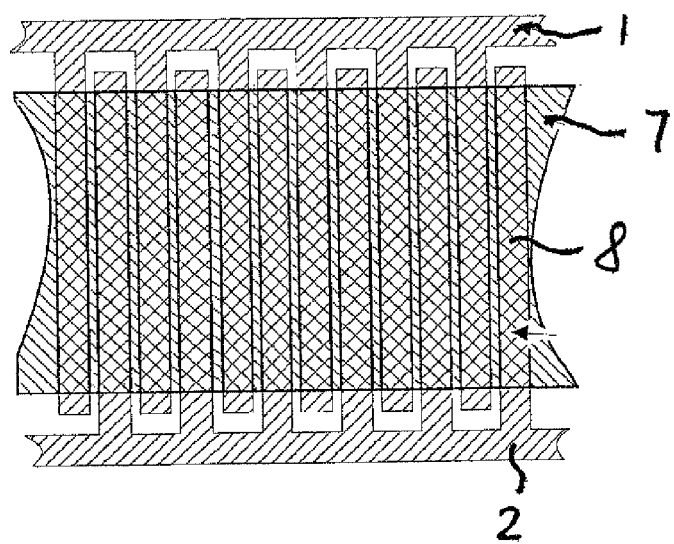

FIG. 2 shows the section of the electrode for the light-emitting organic component in accordance with FIG. 1 having an organic region 7 arranged thereupon which overlaps with the intermeshed comb-shaped electrode sections 5, 6 in an overlap region 8.

Figure 3:
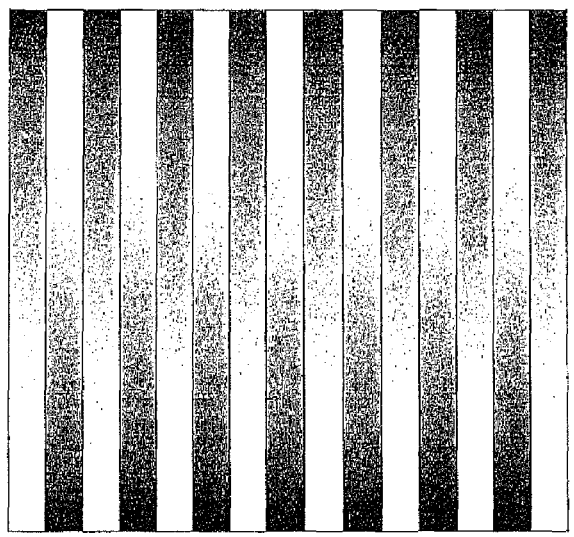

FIG. 3 shows an illumination pattern for a light-emitting organic component having intermeshing comb-shaped sub-electrodes.

In one exemplary embodiment, a light-emitting organic component in the form of an OLED having an active area of 20 mm×20 mm is constructed. A transparent base electrode, as depicted schematically in FIG. 1, is structured on a glass substrate. The individual strips corresponding to the protruding comb-shaped electrode sections 1, 2 have a length of 20 mm and a width of 0.45 mm. The distance between adjacent strips is 0.05 mm. The transparent base electrode consists of 90 nm thick ITO. An orange light-emitting stack made of organic material is deposited on the base electrode formed with the comb-shaped sub-electrodes (cf. FIG. 2):

1) p-doped hole transport layer: 50 nm of 4,4',4''-tris(N,N-diphenylamino)triphenylamine (Starburst TDATA) doped with tetrafluoro-tetracyanoquinodimethane (F4-TCNQ)
2) intermediary layer on the side of the holes: 10 nm of N,N'-bis(3-methylphenyl)-N,N'-bis(phenyl)benzidine (TPD)
3) orange-red emission layer: 20 nm of bis[N-(1-naphthyl)-N-phenyl]benzidine (alpha-NPD) doped with iridium(III)-bis-(2-methyldibenzo[f,h]quinoxaline) (acetylaectonate) (RE076, ADS)
4) intemediary layer on the side of the electrons: 10 nm of bathophenanthroline (BPhen)
5) n-doped electron transport layer: 50 nm of BPhen doped with Cs
6) cathode: 100 nm of aluminium An orange light emission is viewed through the glass substrate and it can be seen with the naked eye that the component is divided in strips which emit brighter light alternately from both sides. This is depicted schematically and in an exaggerated manner in FIG. 3. The component emitting in this way can now already be used in this form. The distinctive radiation of light may be used as a design element, for example a rear light of a car. A diffuser film can be applied to the component thus formed in a complementary manner through which the impression of a completely homogeneous radiation of light is achieved. This would not be the case if all strips were contacted from the same direction, i.e. no intermeshed comb-shaped sub-electrodes were formed as the gradient of the light intensity can then still be observed clearly, even when using a diffuser film.

Figure 4:
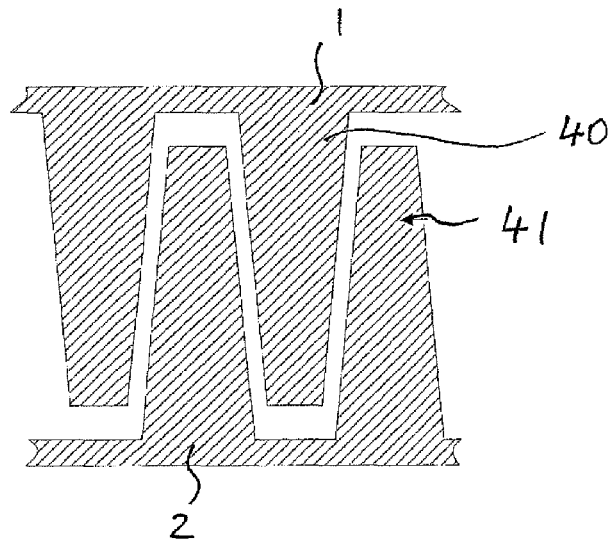

FIG. 4 shows a section of an electrode for a light-emitting organic component in which comb-shaped sub-electrodes intermesh with trapeze-shaped protruding comb-shaped electrode sections 40, 41 of two comb-shaped sub-electrodes 1, 2.

In FIG. 4, a case is depicted schematically in which the protruding comb-shaped electrode sections 40, 41 are tapered from the connection point (comb-shaped electrode connecting section). Such a geometry reduces ohmic losses and increases the performance efficiency of the component. Triangles, trapezes, but also differently shaped structures come into consideration. However, they all are tapered from the connection point in these embodiments.

Figure 5:
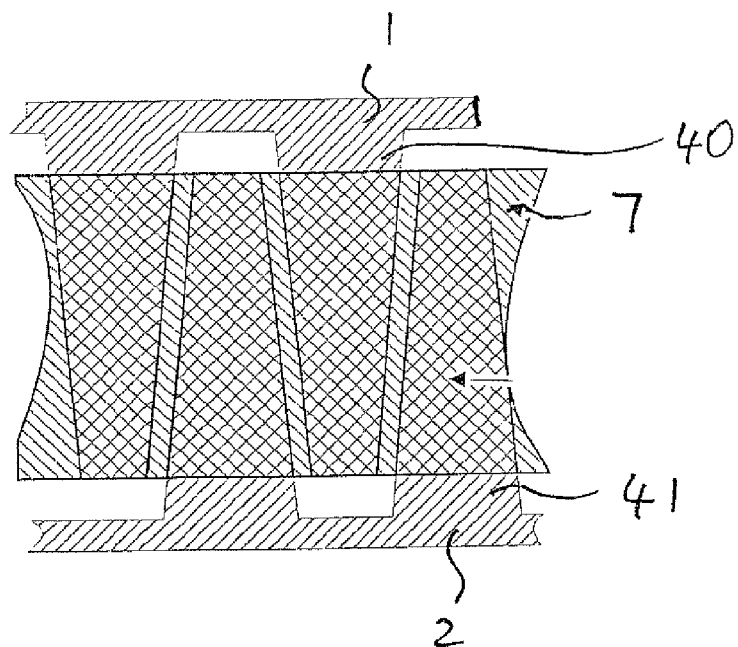

FIG. 5 shows the section of the electrode for the light-emitting organic component in accordance with FIG. 4 having an organic region 7 arranged thereupon.

Figure 6:
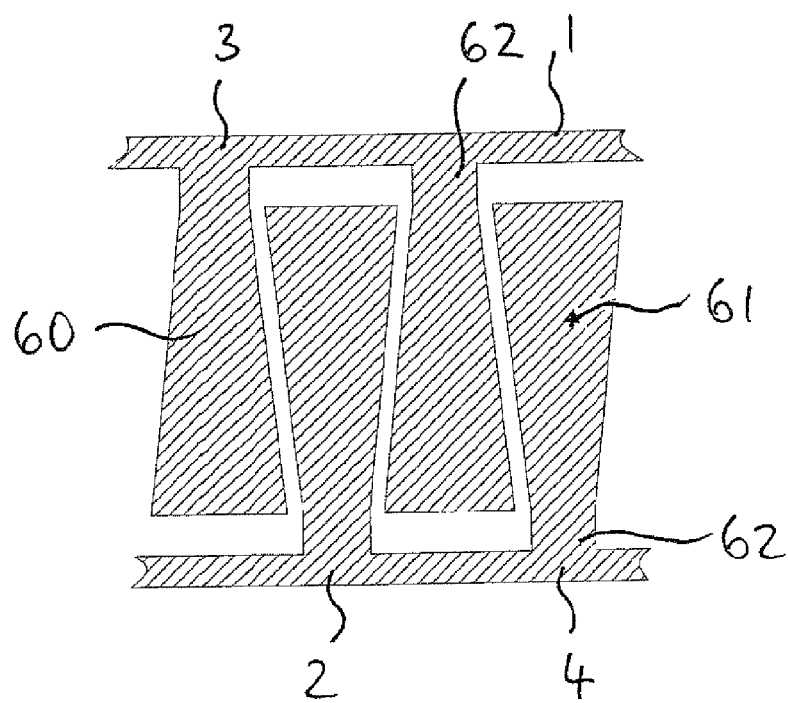

FIG. 6 shows a section of an electrode for a light-emitting organic component in which comb-shaped sub-electrodes intermesh, trapeze-shaped protruding comb-shaped electrode sections 60, 61 being arranged complementary in shape and being connected to comb-shaped electrode connecting sections 3, 4 by means of a supply section 62. Here, the narrowest point is directly at the connection of the respective protruding comb-shaped electrode section 60, 61. Through this, the ohmic losses are indeed increased; however, the homogeneity of the radiation of light can be improved, if required.

Figure 7:
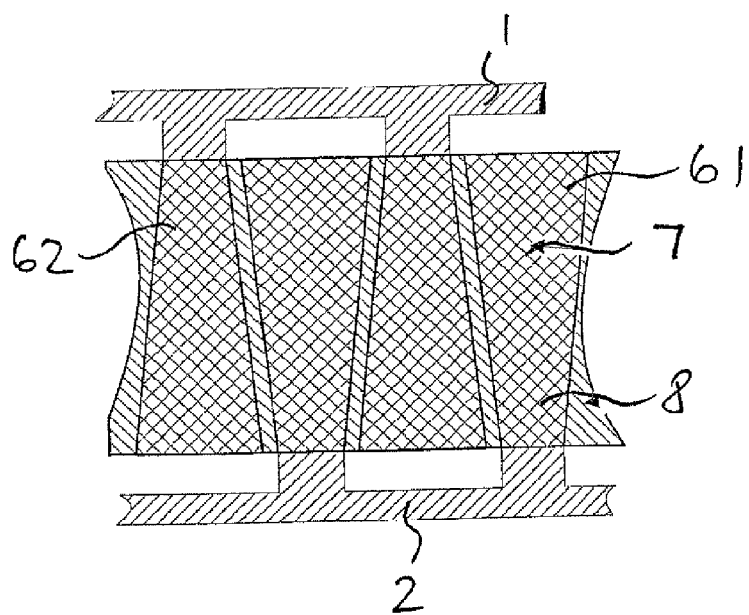

FIG. 7 shows the section of the electrode for the light-emitting organic component in accordance with FIG. 6 having an organic region 7 arranged thereupon.

Figure 8:
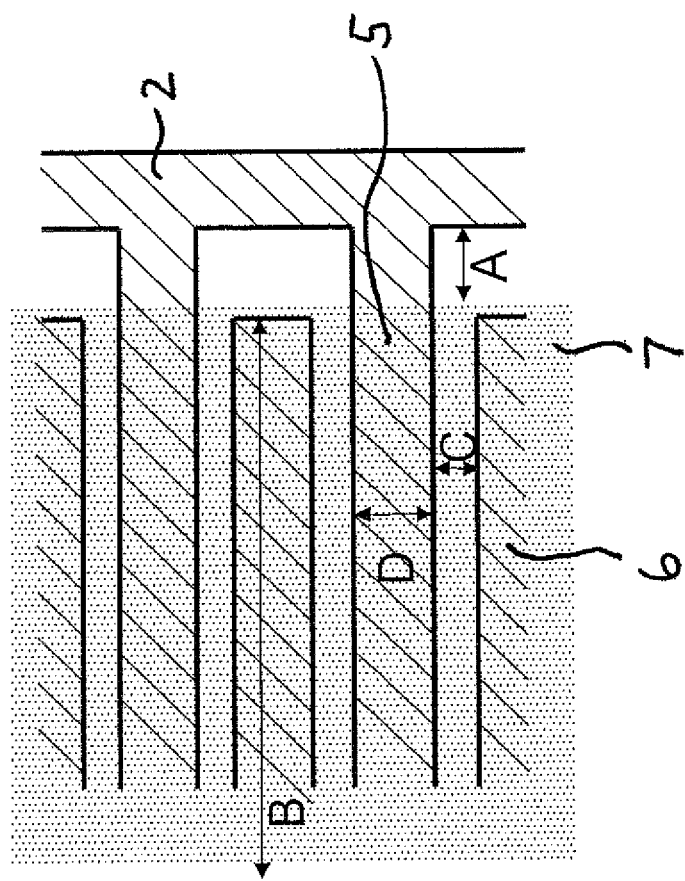

FIG. 8 shows a schematic detailed illustration for the section of the electrode for the light-emitting organic component in FIG. 1. The following parameters are shown: A—length of the proximal end of the protruding comb-shaped electrode section up to the edge of the organic region, B—length of the protruding comb-shaped electrode section from the associated comb-shaped electrode connecting section, C—distance between adjacent comb-shaped electrode sections, and D—width of the protruding comb-shaped electrode section.

Figure 9:
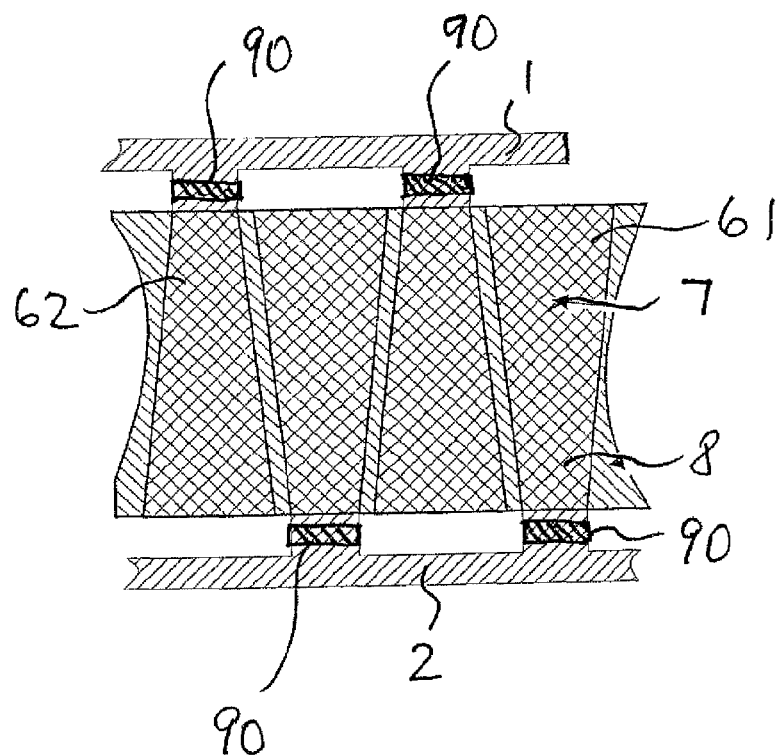

FIG. 9 shows the section of the electrode for the light-emitting organic component having the organic region 7 arranged thereupon in accordance with FIG. 7, safety structures 90 allocated to the protruding comb-shaped electrode sections being shown schematically, which are respective safety fuses, for example.

Further exemplary embodiments are explained below in detail. In this connection, the interaction of the parameters of FIG. 8 are particularly discussed in detail.

In one exemplary embodiment, five light-emitting organic components connected in series are applied onto a glass substrate (not shown). Together, they form an array of light-emitting organic components.

Initially, a respective base electrode made of ITO is structured by photolithography in a comb-like manner with protruding comb-shaped electrode sections which are formed on a comb-shaped electrode connecting section. Length B of the protruding comb-shaped electrode sections is 20 µm; their width D is in each case 1 mm. The layer resistance of ITO is 20 ohm/square. The number of protruding comb-shaped electrode sections in parallel is N=100; their distance C is 20 µm. In this way, an electrode structure is initially created in an optionally separately provided production step, the electrode structure representing an independent product or semi-finished product which may then be used for further processing, be it in a immediately subsequent process or within the course of later processing, for the component production.

For the components, an organic layer region emitting green light is in each case evaporated onto a large area of the electrode structure, at a current efficiency E of 60 cd/A. For this, an organic layer stack known as such is used with the phosphorescent emitter material Ir(ppy)3 emitting green light (cf. He et al., Appl. Phys. Lett., 85 (2004), 3911)). A light intensity H of 6000 cd/m2 is achieved at a voltage U of 4 V and a current density of about 10 mA/cm2. The distance A between the metallic cover or top electrodes of adjacent components is 3 mm.

If now a short forms in the centre of one of the protruding comb-shaped electrode sections made of ITO, the current through the OLED component formed within the region of this section is now only limited by the path resistance of the ITO feed to the component. The feed resistance in this precise case is: S*(B/2D), i.e. 200 ohm. The factor of ½ is due to the short being in the centre of the section.

The OLED components formed in the remaining protruding comb-shaped electrode section are still all operable. Their total resistance, including the ITO path resistance, is about 20 ohm as can be easily calculated from the operating voltage, the surface area and the current density. Here, it is assumed by approximation that the OLED components are illuminated with a homogeneous light intensity on the entire lighting area. In fact, the illumination of the regions of the OLED components in which a certain voltage drop due to the current supply through the electrode has an effect is a bit darker.

The outcome is that just under 10% of the current flows off over the short and more than 90% over the remaining OLED components. This means furthermore that the entire array still emits more than 90% of the light, even in the case of such a short. For the entire array which consists of five such components, despite a short, a radiation of light of about 98% can still be observed. This applies when the short occurs in the centre of a protruding comb-shaped electrode section. If it forms even further away form the comb-shaped electrode connecting section, the ITO path resistance becomes even higher and thus the short-related current again smaller by a factor of at most two. This means that in this case, 99% of the light would still be emitted from the array of components.

The most inconvenient location of a short is in the region of the protruding comb-shaped electrode sections adjacent to the comb-shaped electrode connecting section. In this case, only a protruding comb-shaped electrode section of 3 mm becomes effective (corresponding with the distance between comb-shaped electrode connecting section and edge of the organic region), i.e. a feed resistance of 60 ohm. This means that the affected component continues to be illuminated with a light intensity of about 75%, the entire array even still with 95%. Thus, the outcome is that the component is still very well operable, even in the most inconvenient case of a short.

The lower the ratio of A to D, the higher is the effect of a short near the adjacent comb-shaped electrode connecting section. Thus, the ratio A:D is advantageously higher than 1, preferably higher than 3 and more preferably higher than 10. At a ratio A:D of 1, in the case of a short near the comb-shaped electrode connecting section, by using a diffuser film, a component having, for example, 100 protruding comb-shaped electrode sections still appears to a viewer in a sufficient distance to be illuminated homogenously when viewed with the naked eye, i.e. without special magnifying means, for example a magnifying glass. As long as the ratio A:D is three in this case, a homogeneous appearance would also be achievable without a diffuser film. At a ratio of 10, a homogeneous light intensity could still be perceived by a viewer from a sufficient distance already at a number of streaks of 10 by means of a diffuser film.

If several shorts exist on the array of light-emitting organic components or even on a component, the component still remains operable; however, the efficiency is further reduced with each new short.

A variant to design the individual component to be even more efficient in the case of a short as well is to design the protruding comb-shaped electrode sections even thinner. The ratio of the current through the short to the current through the remaining region of the component can then be improved even more. However, it is not practical to make the strip-shaped electrode sections thinner than the typical lateral expansion of a short. Therefore, protruding electrode sections thinner than 10 µm rather make no sense.

By means of the invention, it is particularly made possible to markedly increase the production yield as components can also then still be used when sporadic shorts have formed.

To improve the optical appearance further, it can be provided for integrating diffuser elements into the component(s) through which, on the one hand, the not illuminated regions between the protruding comb-shaped electrode sections and, on the other hand, the regions failed due to shorts are covered by means of diffused light from other, illuminated regions.

It can also be provided for structuring not the electrode on the substrate side but the cover or top electrode, in particular in strips. This may be performed, for example, by means of laser treatment of a planar cover electrode which is then practically cut into strips. In this connection, even the regions of the organic layer stack located underneath the regions of the cover electrode to be removed can be damaged without this affecting the functionality of the entire component as the regions thus treated are not illuminated anyway.

The proposed array of components, whether with a component or with several components electrically connected in series, may also be employed in displays to form pixel elements, in particular for displays having very big pixel elements with a size of several square centimetres, for example in stadium screens or the like. Here, due to the lighting elements, it is avoided that an entire pixel fails in the case of a short. Instead, the viewer notices only a slightly reduced light intensity of a pixel which is more or less negligible.

The loss in efficiency of the component turns out to be particularly low if the components formed in the region of the strip electrodes themselves have a low ohmic resistance at the operating light intensity. This is in particular the case in OLED components having electrically doped regions in the organic layer stack.

The radiation of light of the component is particularly homogeneous when the luminance-voltage characteristic is not too steep in the region of the operating light intensity. For example, this is the case when a voltage differential of 0.4 V causes a difference in light intensity of at most 40%, preferably at most 20%.

A simplified approximation formula results for the loss in efficiency V of the proposed component in percent when a short occurs at a location which is separated from the comb-shaped electrode connecting section of the adjacent component by a distance K wherein A<K<B shall apply:

$$V=U*E/(M*N*B*H*S*K).$$

Here, M denotes the number of connected components, H the operating light intensity and S the layer resistance of ITO.

This results in a number of additional design rules. The only parameter which can not be influenced is obviously K, the location of the short. Apart from that, it applies that the losses in efficiency in the case of a short turn out to be particularly low when the operating voltage of the OLED components is low, advantageously lower than 10 V, preferably lower than 6 V and more preferably lower than 4 V;

the number of the components of the array is high, advantageously higher than 10, preferably higher than 27 and more preferably higher than 55;

the number of the protruding comb-shaped electrode sections is high, advantageously higher than 10, preferably higher than 30 and more preferably higher than 100;

the OLED components are operated sufficiently bright, advantageously at a light intensity of at least 500 cd/m2, preferably at a light intensity of at least 1000 cd/m2 and more preferably at a light intensity of at least 5000 cd/m2.

The product of S and B is considered in isolation. The higher S, the shorter B has to be as otherwise the ohmic losses over the ITO during normal operation become to high and the component would thus be inefficient. Good results are achieved when the product S*B is between 10 and 1000 mm*ohm/square, preferably between 100 and 1000 mm*ohm/square.

10 V is the approximate operating voltage of a simple organic light-emitting component of the iii type. 6 V corresponds the approximate operating voltage of a more elaborate organic light-emitting component of the iii type as it is known as such from the prior art. 4 V is the approximate operating voltage of an organic light-emitting component of the pin type as it is known as such from the prior art. Furthermore, 10 V, 6 V and 4 V may also be considered as the approximate operating voltages for simple, twice stacked and thrice stacked pin OLEDs.

The light intensity value of 500 cd/m2 represents a threshold value of the light intensity from which the use of the present invention in the lighting technology is considered as being particularly advantageous. If a lighting component has an illuminated total area of 1 square metres, the luminous power at a light intensity of 500 cd/m2 corresponds to about half the luminous power of an incandescent lamp of 100 W. The light intensity of 1000 cd/m2 corresponds to about the threshold at which a lighting element is perceived by a viewer as just about not glaring, as long as it is employed in a lighting situation as a ceiling lamp, for example. 5000 cd/m2 correspond with a light intensity which is considered as the most convenient value for a maximisation between luminous power per illuminated surface area of the light-emitting component and life of the light-emitting component. For a commercial optimisation of a product, it can make sense to aim for a light intensity in this region to create a concerted balance between the acquisition and production costs of the component on the one hand and the operating performance and the life on the other hand.

The features of the invention disclosed in the above description, the claims and the drawing can be of importance both taken on their own and in any combination to implement the invention in its different embodiments.

The invention claimed is:

1. A light-emitting organic component comprising an electrode, a counter electrode, and an organic region arranged between the electrode and the counter electrode,
    wherein the organic region between the electrode and the counter electrode comprises a uniform material composition over its planar expansion,
    wherein the electrode comprises two comb-shaped sub-electrodes electrically shorted among each other, a plurality of comb-shaped electrode sections, and a plurality of comb-shaped electrode connecting sections,
    wherein the plurality of comb-shaped electrode sections protrude from respective ones of the plurality of comb-shaped electrode connecting sections of the two comb-shaped sub-electrodes,
    wherein the plurality of comb-shaped electrode sections are arranged in an intermeshing pattern, and
    wherein the organic region at least partially overlaps with the plurality of comb-shaped electrode sections.

2. The component according to claim 1, wherein the protruding comb-shaped electrode sections are complementary in shape.

3. The component according to claim 1 wherein the protruding comb-shaped electrode sections comprise non-parallel lateral edges.

4. The component according to claim 3, wherein the protruding comb-shaped electrode sections comprise a base area shape selected from the group consisting of: base area shape tapering away from the respective comb-shaped electrode connecting section, base area shape widening away from the respective comb-shaped electrode connecting section, triangle, and trapeze.

5. The component according to claim 1, wherein the protruding comb-shaped electrode sections comprise a uniform base area shape.

6. The component according to claim 1, wherein the protruding comb-shaped electrode sections are electrically shorted among each other by the plurality of comb-shaped electrode connecting sections that do not overlap with the organic region.

7. The component according to claim 1, wherein the counter electrode is arranged within the planar expansion of the organic region, and wherein the surface area expansion of the counter electrode is smaller than the planar expansion of the organic region.

8. The component according to claim 1, wherein an end of at least one of the plurality of protruding comb-shaped electrode sections distal to its respective comb-shaped electrode connecting section terminates with an edge of the organic region so that it does not extend beyond the planar expansion of the organic region.

9. The component according to claim 1, wherein an end of at least one of the plurality of protruding comb-shaped electrode sections proximal to its respective comb-shaped electrode connecting section has a length, A, up to the edge of the organic region so that it does not extend beyond the planar expansion of the organic region, and a width. D, and wherein at least one of the plurality of protruding comb-shaped electrode sections comprise a length ratio, A:D, of at least about 1.

10. The component of claim 9, wherein the length ratio, A:D, is at least about 3.

11. The component of claim 9, wherein the length ratio, A:D, is at least about 10.

12. The component according to claim 1, wherein the electrode is on the side of the substrate.

13. The component according to claim 1, wherein a lateral distance between at least two adjacent protruding comb-shaped electrode sections within the intermeshing region is less than about 10 μm.

14. The component according to claim 1, wherein a diffuser element least partially overlaps with the organic region.

15. The component according to claim 1, wherein at least one of the plurality of protruding comb-shaped electrode sections comprises an electrical safety structure.

16. An array comprising a serial connection of a plurality of light-emitting organic components, wherein at least one of the light-emitting organic components comprise an electrode a counter electrode and an organic region arranged between the electrode and the counter electrode, wherein the organic region between the electrode and the counter electrode comprises a uniform material composition over its planar expansion, wherein the electrode comprises two comb-shaped sub-electrodes electrically shorted among each other, a plurality, of comb-shaped electrode sections, and a plurality of comb-shaped electrode connecting sections, wherein the plurality of comb-shaped electrode sections protrude from respective ones of the plurality of comb-shaped electrode connecting sections of the two comb-shaped sub-electrodes.

wherein the plurality of comb-shaped electrode sections are arranged in an intermeshing pattern, and wherein the organic region at least partially overlaps with the plurality of comb-shaped electrode sections.

17. An electrode structure for an electronic component comprising an electrode comprising at least two comb-shaped sub-electrodes electrically shorted among each other, a plurality of comb-shaped electrode sections protruding from a plurality of comb-shaped electrode connecting sections, wherein the plurality of comb-shaped electrode sections are arranged in an intermeshing pattern at least in areas in the comb-shaped sub-electrodes.

* * * * *

UNITED STATES PATENT AND TRADEMARK OFFICE
CERTIFICATE OF CORRECTION

PATENT NO. : 8,466,457 B2
APPLICATION NO. : 12/937969
DATED : June 18, 2013
INVENTOR(S) : Jan Birnstock et al.

It is certified that error appears in the above-identified patent and that said Letters Patent is hereby corrected as shown below:

In the Claims:

At column 17, line 34, after "element" insert --at--.

At column 18, line 6, after "electrode" insert --,--.

At column 18, line 7, after "counter electrode" insert --,--.

At column 18, line 15, delete "," after "rality".

Signed and Sealed this
Thirtieth Day of July, 2013

Teresa Stanek Rea
*Acting Director of the United States Patent and Trademark Office*